(12) United States Patent
Arulalan et al.

(10) Patent No.: US 12,568,828 B2
(45) Date of Patent: *Mar. 3, 2026**

(54) METHOD AND SYSTEM FOR FABRICATING REGROWN FIDUCIALS FOR SEMICONDUCTOR DEVICES

(71) Applicant: SEMICONDUCTOR COMPONENTS INDUSTRIES, LLC, Scottsdale, AZ (US)

(72) Inventors: Karthik Suresh Arulalan, Santa Clara, CA (US); Jianfeng Wang, Santa Clara, CA (US); Sharlene Wilson, Santa Clara, CA (US); Mark Curtice, Santa Clara, CA (US); Subhash Srinivas Pidaparthi, Santa Clara, CA (US); Clifford Drowley, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 482 days.

This patent is subject to a terminal disclaimer.

(21) Appl. No.: 18/097,683

(22) Filed: Jan. 17, 2023

(65) Prior Publication Data

US 2023/0230931 A1      Jul. 20, 2023

Related U.S. Application Data

(60) Provisional application No. 63/300,572, filed on Jan. 18, 2022.

(51) Int. Cl.
    *H01L 23/544*      (2006.01)
    *H01L 21/02*       (2006.01)
    (Continued)

(52) U.S. Cl.
    CPC ........ *H01L 23/544* (2013.01); *H01L 21/0254* (2013.01); *H01L 21/0262* (2013.01);
    (Continued)

(58) Field of Classification Search
    CPC ......... H01L 23/544; H01L 2223/54426; H01L 21/0254; H01L 21/3065; H01L 21/3083; H10D 84/834
    See application file for complete search history.

(56) References Cited

U.S. PATENT DOCUMENTS

| | | | |
|---|---|---|---|
| 11,315,884 B2 * | 4/2022 | Drowley | ................ H10D 30/62 |
| 2021/0020580 A1 * | 1/2021 | Drowley | ............ H10D 84/0158 |

* cited by examiner

*Primary Examiner* — Suberr L Chi

(74) *Attorney, Agent, or Firm* — Kevin B. Jackson

(57) ABSTRACT

A method of forming regrown fiducials includes providing a III-V compound substrate having a device region and an alignment mark region. The III-V compound substrate is characterized by a processing surface. The method also includes forming a hardmask layer having a first set of openings in the device region exposing a first surface portion of the processing surface of the III-V compound substrate and a second set of openings in the alignment mark region exposing a second surface portion of the processing surface and etching the first surface portion and the second surface portion of the III-V compound substrate using the hardmask layer as a mask to form a plurality of trenches. The method also includes epitaxially regrowing a semiconductor layer in the trenches to form the regrown fiducials extending to a predetermined height over the processing surface in the alignment mark region.

13 Claims, 11 Drawing Sheets

(51) Int. Cl.
| | |
|---|---|
| *H10D 84/83* | (2025.01) |
| *H01L 21/3065* | (2006.01) |
| *H01L 21/308* | (2006.01) |
| *H10D 30/01* | (2025.01) |

(52) U.S. Cl.
CPC .. *H01L 21/02639* (2013.01); *H01L 21/02642* (2013.01); *H10D 84/834* (2025.01); *H01L 21/3065* (2013.01); *H01L 21/3083* (2013.01); *H01L 2223/54426* (2013.01); *H10D 30/021* (2025.01); *H10D 30/024* (2025.01); *H10D 30/051* (2025.01)

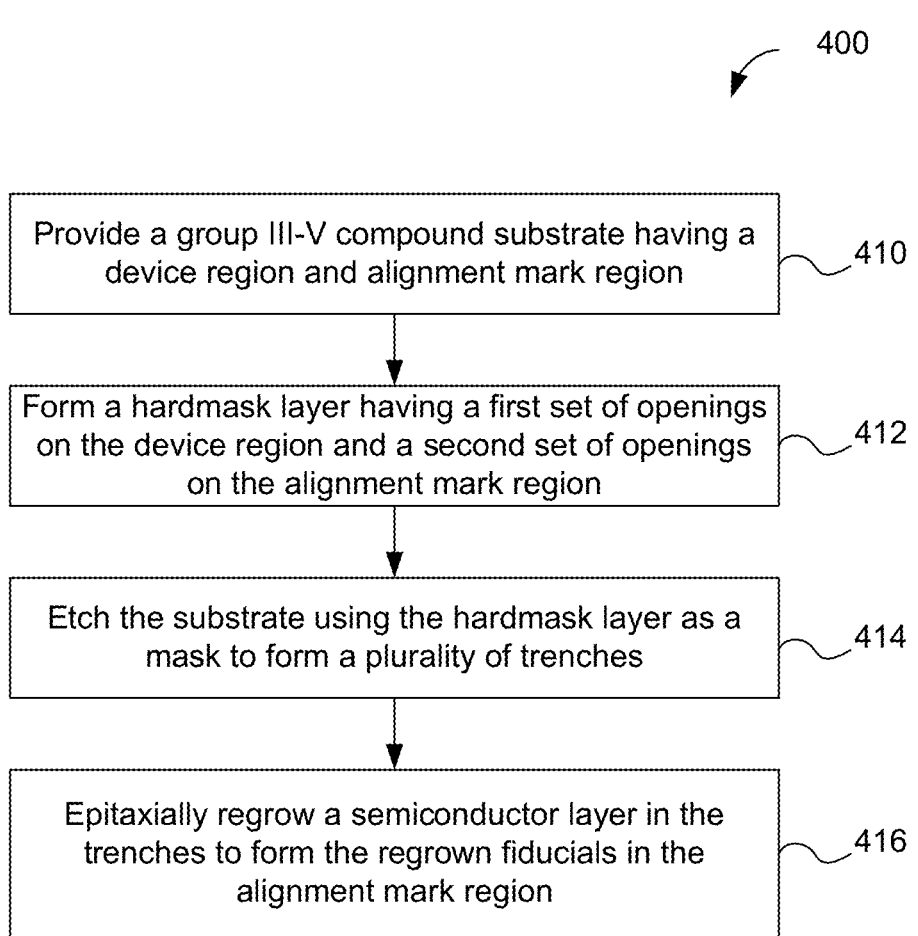

400

Provide a group III-V compound substrate having a device region and alignment mark region — 410

Form a hardmask layer having a first set of openings on the device region and a second set of openings on the alignment mark region — 412

Etch the substrate using the hardmask layer as a mask to form a plurality of trenches — 414

Epitaxially regrow a semiconductor layer in the trenches to form the regrown fiducials in the alignment mark region — 416

FIG. 4

☐ Hardmask Layer     ▨ III-Nitride Layer

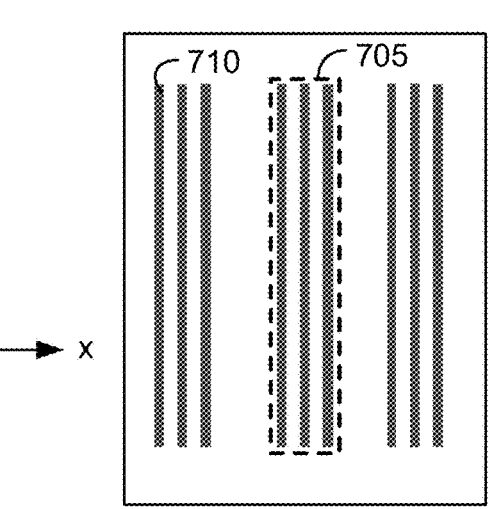
FIG. 7A
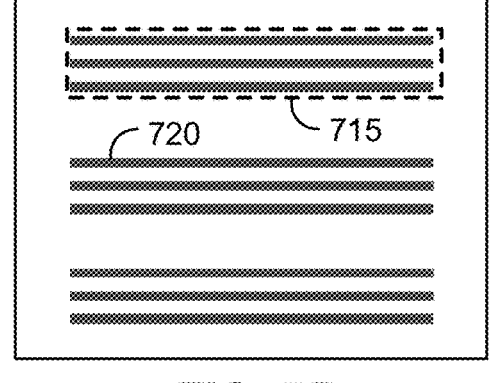
FIG. 7B
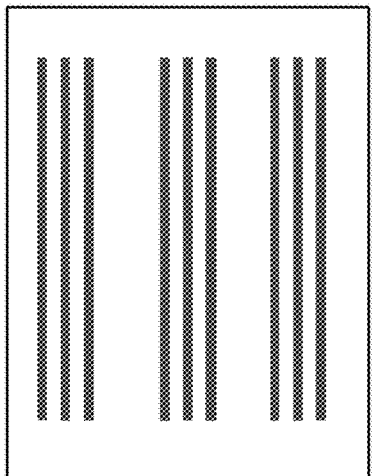
FIG. 7C
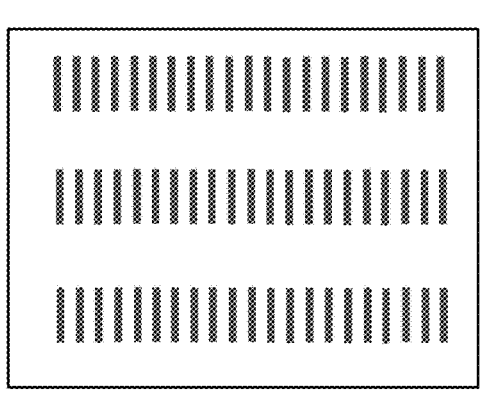
FIG. 7D
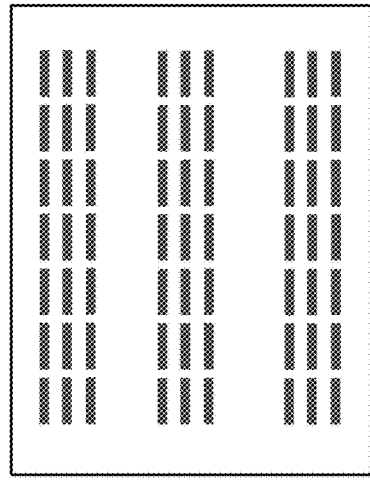
FIG. 7E
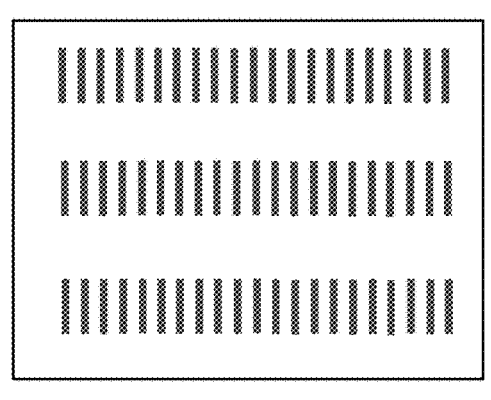
FIG. 7F
 Hardmask Layer     ☐ III-Nitride Layer

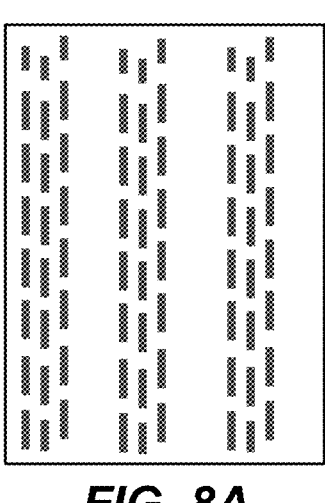
FIG. 8A
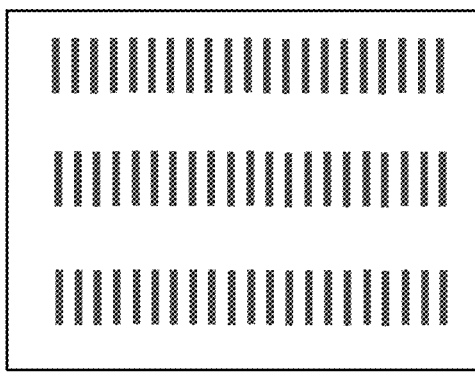
FIG. 8B
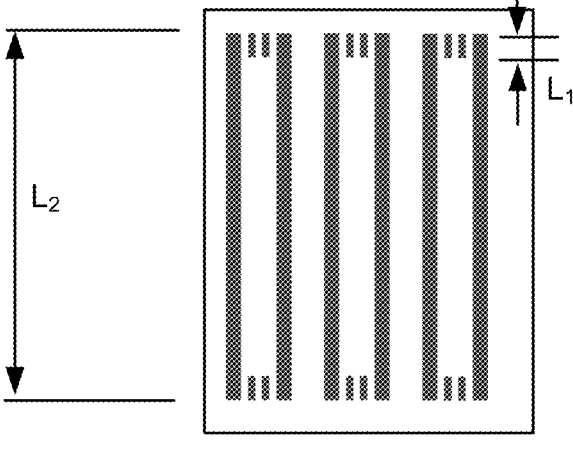
FIG. 8C
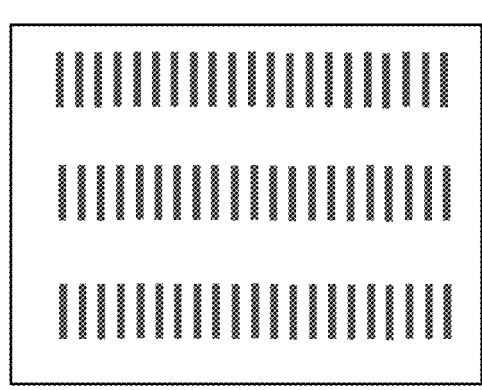
FIG. 8D
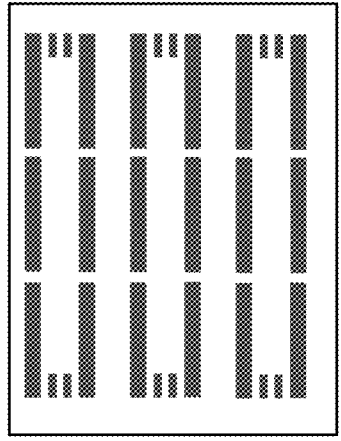
FIG. 8E
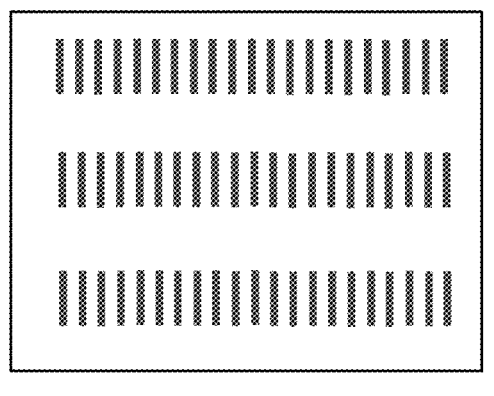
FIG. 8F
☐ Hardmask Layer     ▨ III-Nitride Layer ☐ Hardmask Layer     ▨ III-Nitride Layer ☐ Hardmask Layer     ▨ III-Nitride Layer

METHOD AND SYSTEM FOR FABRICATING REGROWN FIDUCIALS FOR SEMICONDUCTOR DEVICES

CROSS-REFERENCES TO RELATED APPLICATIONS

This application claims the benefit of U.S. Provisional Application No. 63/300,572, filed on Jan. 18, 2022, the contents of which are hereby incorporated by reference in their entirety for all purposes.

BACKGROUND OF THE INVENTION

A sequence of photolithography steps is generally required in the manufacture of semiconductor devices. Accordingly, in order to provide for alignment between a previously processed layer and a current layer, one or more fiducials, also referred to as alignment marks, can be formed as topographical steps or recesses in the processed layer. A protective layer (e.g., silicon oxide) may be formed over the topographical features in order to prevent damage to the fiducials (alignment marks) in a subsequent process. However, the protective layer can limit the resolution of the fiducials and increase the cost and processing time.

For example, some semiconductor fabrication processes require fiducials, i.e., alignment marks, that require at least one and sometimes two or more additional masking steps. The additional fiducials and associated processing add tooling costs, cycle time, and potential defects to the process flow. Thus, there is a need in the art for improved methods and systems related to fiducials.

SUMMARY OF THE INVENTION

The present invention generally relates to fabrication of fiducials or alignment marks during semiconductor processing, for example, during the process flow for the fabrication of a regrown field effect transistor (FET). These regrown fiducials can be used as alignment marks and are tolerant to variations in the regrowth process compared to conventional techniques.

As described herein, embodiments of the present invention provide a method of forming alignment marks and semiconductor devices having such alignment marks. In particular, in some semiconductor manufacturing processes, the surface of the semiconductor can be made substantially planar at certain steps in the process. One such process is selective area regrowth to form semiconductor layers embedded within an existing pattern. An example of such a regrowth that provides a substantially planar surface is given in U.S. Pat. No. 9,117,839 (Kizilyalli, et al.). In such a selective area regrowth process, it is desirable to be able to simultaneously form alignment structures having topographic relief relative to the planar regrowth surface.

As described more fully below, embodiments of the present invention enable the formation of regrown fiducials by a combination of patterning and etching of a hardmask. The methods and systems described herein provide uniform regrowth, thereby offsetting variations in the regrowth process. Subsequent photolithography layers can use these regrown fiducials for alignment.

Although regrown fiducials used as components of alignment marks are discussed in some embodiments in relation to semiconductor process flows during fabrication of semiconductor electronic devices, specifically for photolithography exposure tools, this is not required by the present invention and the regrown fiducials discussed herein are applicable in a variety of applications utilizing optical pattern recognition including overlay measurement tools, defect scan tools, metrology tools, wafer testers, and the like.

According to an embodiment of the present invention, a method of forming regrown fiducials is provided. The method includes providing a III-V compound substrate having a device region and an alignment mark region. The III-V compound substrate is characterized by a processing surface. The method also includes forming a hardmask layer having a first set of openings in the device region exposing a first surface portion of the processing surface of the III-V compound substrate and a second set of openings in the alignment mark region exposing a second surface portion of the processing surface of the III-V compound substrate and etching the first surface portion and the second surface portion of the III-V compound substrate using the hardmask layer as a mask to form a plurality of trenches. The method further includes epitaxially regrowing a semiconductor layer in the trenches to form the regrown fiducials extending to a predetermined height over the processing surface of the III-V compound substrate in the alignment mark region.

In some embodiments, the III-V compound substrate comprises a GaN substrate and a plurality of epitaxial III-V layers. The trenches can each have a depth of about 0.8 µm. The trenches in the device region can each have a width of about 2 µm. In some implementations, a width of the regrown fiducials is between 0.1 µm and 1 µm and a pitch of the regrown fiducials is between 0.2 µm and 1.2 µm. The width can be between 0.4 µm and 0.6 µm and the pitch can be between 0.5 µm and 1.2 µm. The trenches in the device region can be characterized by a first pitch and the regrown fiducials are characterized by a second pitch less than the first pitch. A set of regrown fiducials in the alignment mark region can form an alignment mark. In an embodiment, the regrown fiducials are elongated and a length of the regrown fiducials is parallel to an m-plane of the III-V compound substrate. In another embodiment, the first set of openings includes an array of elongated openings arranged in parallel to each other configured to form a plurality of semiconductor fins. The elongated openings can each have a width in a range between about 0.2 µm and about 0.3 µm, a length in a range between about 10 µm and about 1000 µm, and a pitch between two adjacent elongated openings is in a range between about 1.9 µm and about 10 µm. The III-V compound substrate can include an n-GaN epitaxial layer and the semiconductor layer can include a p-GaN epitaxial layer. Epitaxially regrowing the semiconductor layer can be self-limiting in the alignment mark region.

According to another embodiment of the present invention, a semiconductor device is provided. The semiconductor device includes a III-V compound substrate comprising a device region and an alignment mark region including a plurality of fiducial trenches and a plurality of electronic devices in the device region. The semiconductor device also includes a plurality of regrown fiducials in the alignment mark region. Each of the plurality of regrown fiducials is disposed in one of the plurality of fiducial trenches.

In some embodiments, each of the plurality of regrown fiducials includes a protrusion portion extending above a surface of the III-V compound substrate. The protrusion portion can have a shape of an isosceles triangle or a trapezoid with a base substantially flush with a surface of the III-V compound substrate in a cross-sectional view. The protrusion portion can have a shape of an isosceles triangle having a base substantially flush with a surface of the III-V compound substrate. In these embodiments, the protrusion portion extends to a predetermined height over a surface of the III-V compound substrate and the predetermined height is determined using the equation: $H=(\sqrt{3}/2)*W$, where H is the predetermined height and W is a width of the base of the isosceles triangle.

In some embodiments, the semiconductor device also includes a hardmask in the alignment mark region. The plurality of regrown fiducials can include multiple sets of regrown fiducials, with each set of the multiple sets of regrown fiducials forming an alignment mark. The plurality of electronic devices in the device region can include an array of FinFETs, a set of regrown fiducials of the plurality of regrown fiducials can be characterized by a first pitch between each of the plurality of regrown fiducials in the set, and a second pitch associated with the array of FinFETs can be greater than the first pitch. The III-V compound substrate can include an N—GaN epitaxial layer and the plurality of regrown fiducials can include a p-GaN epitaxial layer. The device region can include a plurality of semiconductor fins arranged parallel to each other.

According to a specific embodiment of the present invention, a set of alignment marks are provided. The set of alignment marks include a first alignment mark of the set of alignment marks, wherein the first alignment mark includes a first plurality of regrown fiducials, each of the first plurality of regrown fiducials being characterized by a width and a length. The first plurality of regrown fiducials are arrayed along a first direction parallel to the width and along a second direction parallel to the length. The set of alignment marks also includes a second alignment mark of the set of alignment marks, wherein the second alignment mark includes a second plurality of regrown fiducials, each of the second plurality of regrown fiducials being characterized by the width and the length. The second plurality of regrown fiducials are arrayed along the first direction parallel to the width and along the second direction parallel to the length.

In some embodiments, the first plurality of regrown fiducials are arrayed along the first direction with a first pitch. The width can be equal to half the first pitch. The first plurality of regrown fiducials can be arrayed along the second direction with a second pitch. The length can be less than the second pitch.

According to a particular embodiment, a set of alignment marks are provided. The set of alignment marks include a first alignment mark of the set of alignment marks, wherein the first alignment mark includes a first plurality of regrown fiducials, each of the first plurality of regrown fiducials being characterized by a width and a length. The first plurality of regrown fiducials are arrayed along a first direction parallel to the width. The set of alignment marks also includes a second alignment mark of the set of alignment marks, wherein the second alignment mark includes a second plurality of regrown fiducials, each of the second plurality of regrown fiducials being characterized by the width and the length. The second plurality of regrown fiducials are arrayed along the first direction parallel to the width. The second alignment mark is positioned a predetermined distance measured along the length from the first alignment mark.

In some embodiments, the length is parallel to an m-plane of a GaN substrate. The first alignment mark can be characterized by a second width and a second length, wherein the width is parallel to the second length and the length is equal to the second width. The second length can be parallel to an a-plane of a GaN substrate.

Numerous benefits are achieved by way of the present invention over conventional techniques. For example, embodiments of the present invention provide alignment marks including a plurality of regrowth fiducials that are tolerant to regrowth variation while not adding additional steps to the fabrication process flow. These and other embodiments of the invention along with many of its advantages and features are described in more detail in conjunction with the text below and attached figures.

BRIEF DESCRIPTION OF THE DRAWINGS

FIG. 4 is a simplified flowchart illustrating a method of forming regrown fiducials (i.e., regrown fiducials making up alignment marks) during the formation of integrated circuits on semiconductor wafers according to an embodiment of the present invention.

FIGS. 7A and 7B are plan views of regrown fiducials for a set of X alignment marks and a set of Y alignment marks, respectively, according to a first embodiment of the present invention.

FIGS. 7C and 7D are plan views of regrown fiducials for a set of X alignment marks and a set of Y alignment marks, respectively, according to a second embodiment of the present invention.

FIGS. 7E and 7F are plan views of regrown fiducials for a set of X alignment marks and a set of Y alignment marks, respectively, according to a third embodiment of the present invention.

FIGS. 8A and 8B are plan views of regrown fiducials for a set of X alignment marks and a set of Y alignment marks, respectively, according to a fourth embodiment of the present invention.

FIGS. 8C and 8D are plan views of regrown fiducials for a set of X alignment marks and a set of Y alignment marks, respectively, according to a fifth embodiment of the present invention.

FIGS. 8E and 8F are plan views of regrown fiducials for a set of X alignment marks and a set of Y alignment marks, respectively, according to a sixth embodiment of the present invention.

DETAILED DESCRIPTION OF SPECIFIC EMBODIMENTS

Some semiconductor devices include one or more layers of epitaxially grown semiconductor materials. Selective area metal-organic chemical vapor deposition (SA-MOCVD) is one of the fabrication methods for vertical fin field effect transistor (FinFET) devices.

Figure 1:
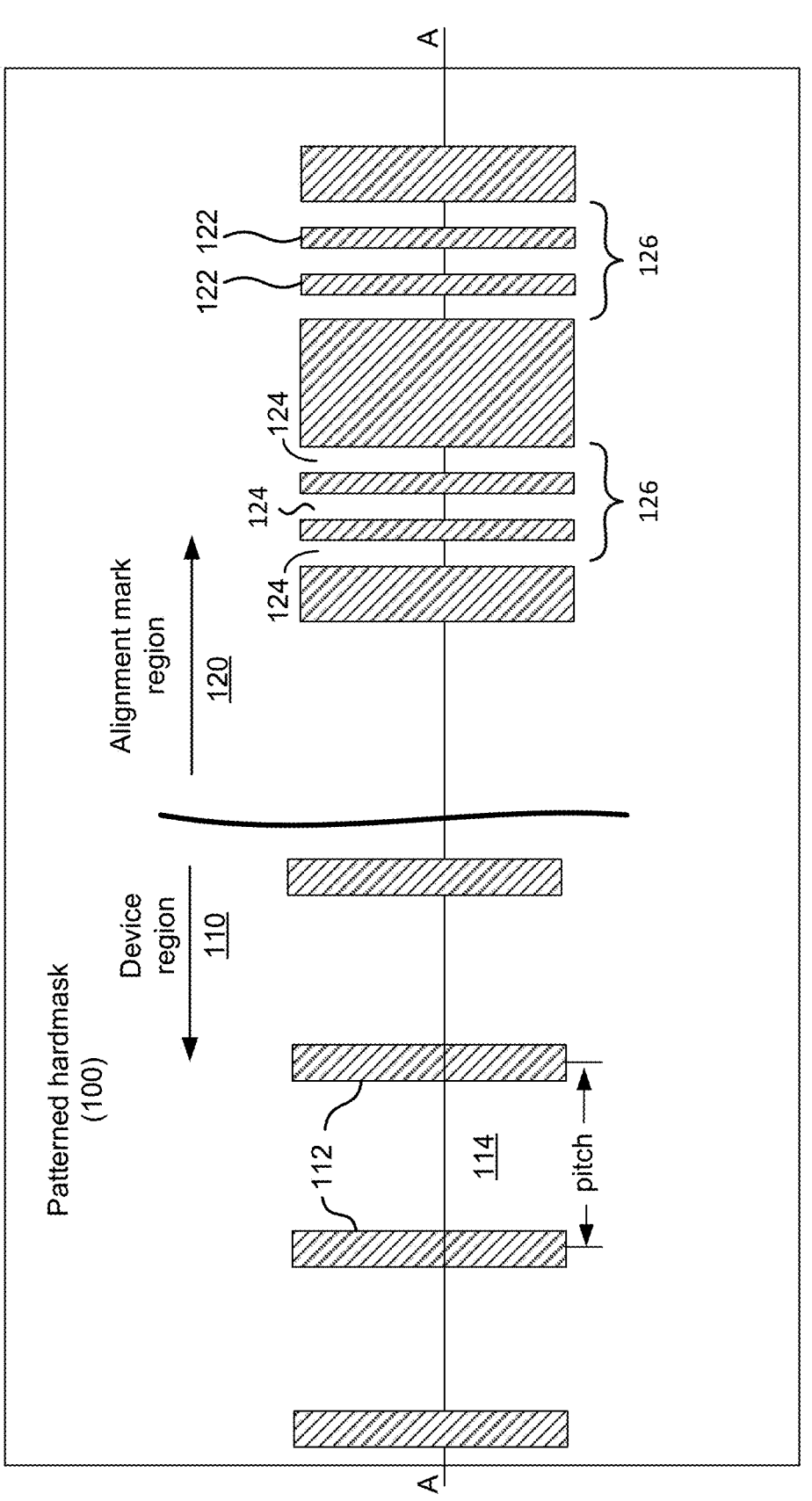
FIG. 1 is a plan view of a patterned hardmask layer including a fin layout in a device region and an alignment mark mask layout in an alignment mark region according to an embodiment of the present invention.

FIG. 1 is a plan view of a patterned hardmask layer including a fin layout in a device region and an alignment mark mask layout in an alignment mark region according to an embodiment of the present invention. FIG. 1 represents a portion of a larger mask utilized during fabrication of FinFETs. A method of manufacturing a semiconductor device may include providing a semiconductor substrate, e.g., a III-nitride compound substrate. In an embodiment, the III-nitride compound substrate is an n-type gallium nitride (GaN) substrate on which is grown an n-type GaN epitaxial layer, a second n-type GaN epitaxial layer with a graded dopant concentration, and a third n-type GaN epitaxial layer with a higher dopant concentration than the first epitaxial layer. The method also includes forming a patterned hardmask layer on the semiconductor substrate. In addition to GaN substrates, other substrates suitable for supporting regrowth can be utilized, including GaN on silicon carbide (SiC), GaN on silicon, or the like.

As illustrated in FIG. 1, the patterned hardmask layer 100 has a device region 110 including a plurality of fin mask areas 112 corresponding to fins that will be protected by the hardmask and an alignment mark region 120 including a plurality of alignment mark mask areas 122 separated by alignment mark openings 124. The plurality of fin mask areas 112 are separated by openings 114. In some embodiments, the plurality of openings 114 between fin mask areas 112 each have a width of about 1.8 µm, the fin mask areas 112 each have a width of about 0.2 µm, and the pitch measured from center-to-center of two adjacent openings 114 is about 2.0 µm.

In some embodiments, the plurality of alignment mark openings 124 can each have a width ranging from about 0.1 µm to 1.0 µm, for example, 0.1 µm, 0.2 µm, 0.3 µm, 0.4 µm, 0.5 µm, 0.6 µm, 0.7 µm, 0.8 µm, 0.9 µm, 1.0 µm, or greater than 1.0 µm. The plurality of alignment mark mask areas 122 each have a width ranging from about 0.1 µm to 2.0 µm, for example, 0.1 µm, 0.2 µm, 0.3 µm, 0.4 µm, 0.5 µm, 0.6 µm, 0.7 µm, 0.8 µm, 0.9 µm, 1.0 µm, 1.5 µm, 2.0 µm, or greater than 2.0 µm. In some embodiments, multiple sets of alignment mark openings 126 are provided and the pitch measured from center-to-center of two adjacent sets of alignment mark openings 126 ranges from about 0.2 µm to 2.0 µm, for example, 0.1 µm, 0.2 µm, 0.3 µm, 0.4 µm, 0.5 µm, 0.6 µm, 0.7 µm, 0.8 µm, 0.9 µm, 1.0 µm, 1.25 µm, 1.5 µm, 1.75 µm, 2 µm, or greater than 2.0 µm. Other embodiments can utilize other values for the width and center-to-center spacing of the alignment mark openings as well as the width and center-to-center spacing of the fin mask area openings and these values are merely exemplary. One of ordinary skill in the art would recognize many variations, modifications, and alternatives.

It should be appreciated that although each set of alignment mark openings 126 is illustrated by three alignment mark openings 124, this is merely exemplary and in other embodiments, each set of alignment mark openings includes two, three, four, five, six, seven, eight, nine, ten, eleven, twelve, thirteen, fourteen, fifteen, or more than fifteen alignment mark mask areas, with the width of the set of alignment mark openings 126 being in the range of several microns, the width of the alignment mark openings 124 being in the range of sub-micron to several microns, and the pitch measured from center-to-center of two adjacent sets of alignment mark openings being in the range of several to tens of microns.

Although only a portion of the device region 110 and the alignment mark region 120 are illustrated in FIG. 1, it will be appreciated that both the device region 110 and the alignment mark region 120 will include additional mask patterns and a single substrate can support multiple device regions and alignment mark regions. One of ordinary skill in the art would recognize many variations, modifications, and alternatives.

Figures 2A, 2B:
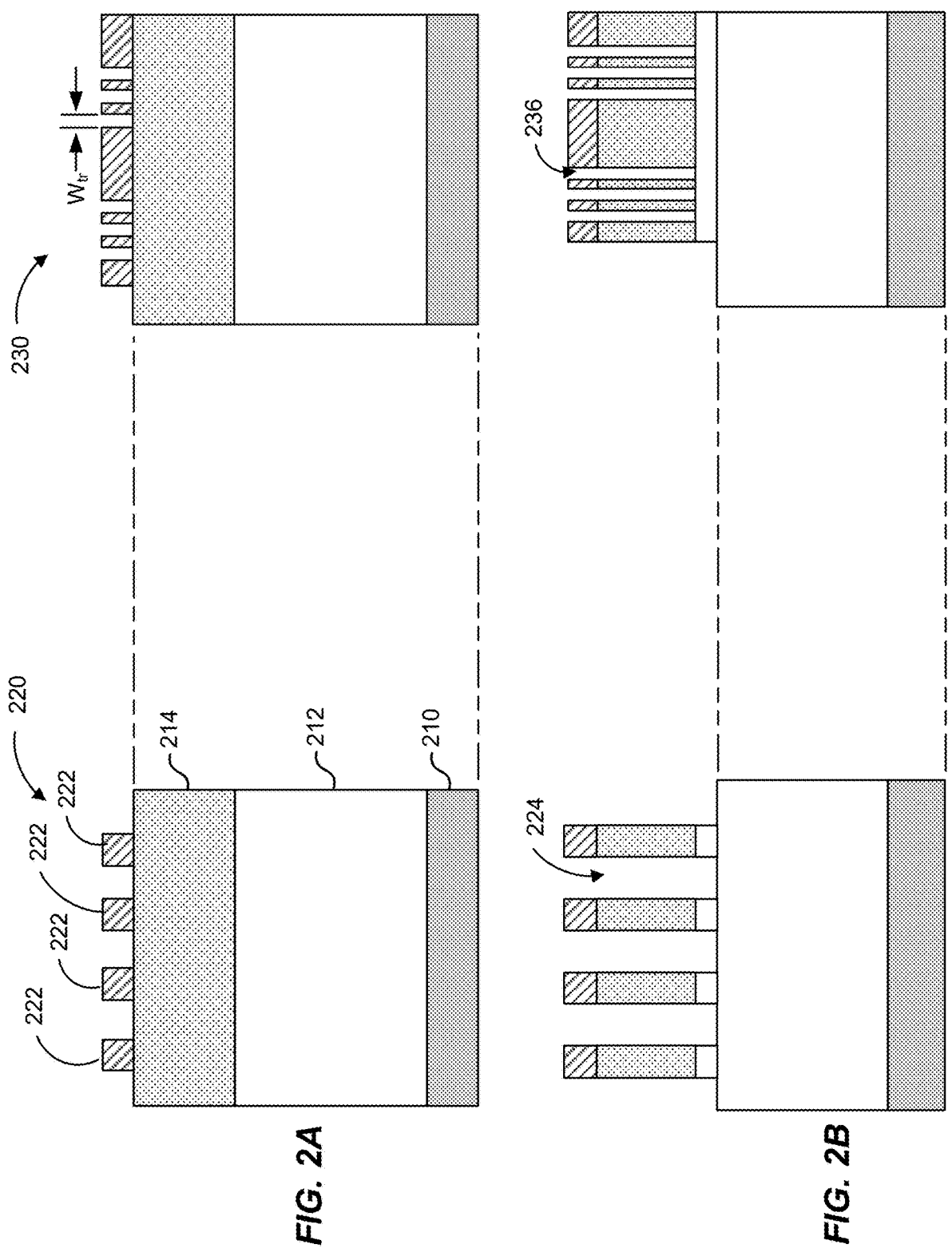
FIG. 2A is a partial cross-sectional view of the patterned hardmask layer taken along line A-A of FIG. 1 according to an embodiment of the present invention.
FIG. 2B is a partial cross-sectional view of formation of patterned trenches according to an embodiment of the present invention.

FIG. 2A is a partial cross-sectional view of the patterned hardmask layer taken along line A-A of FIG. 1 according to an embodiment of the present invention. In FIG. 2A, substrate 210, drift layer 212 (also referred to as a first semiconductor, e.g., III-N, layer), and channel layer 214 (also referred to as a second semiconductor, e.g., III-N, layer) are illustrated in conjunction with the structure of a FinFET, but other semiconductor layers can be utilized as appropriate to the particular application. A hardmask layer (not shown) is formed on channel layer 214. The hardmask layer can include one or more dielectrics such as oxides and nitrides or other suitable materials (including, e.g., refractory metals, metal alloys or metal compounds) that can be deposited and patterned, withstand etching processes, and withstand high temperature regrowth processes. In some embodiments, the hardmask layer has a main lateral surface coinciding with the (0001) plane of the semiconductor substrate, which may be a gallium nitride (GaN) substrate. In some embodiments, the semiconductor substrate may be misoriented from the <0001> direction by an angle.

According to embodiments of the present disclosure, the hardmask material may include silicon dioxide, silicon nitride, aluminum nitride, aluminum oxide, titanium nitride, hafnium oxide, combinations thereof, or the like. The thickness of the hardmask material can vary from a few nanometers to about four hundred nm. Conventional photolithographic semiconductor processes may include, e.g., spin coating a photoresist on the hardmask material, selectively exposing the photoresist to light, developing the photoresist, and etching the hardmask material using the photoresist as a mask. In one embodiment, the hardmask material can be deposited by plasma enhanced chemical vapor deposition (PECVD). In one embodiment, the hardmask material can be deposited by low pressure PECVD (LPCVD). In one embodiment, the hardmask material can be deposited by physical vapor deposition (PVD), e.g., sputtering.

In the device region 220, a set of fin mask areas 222 has been formed using a patterning and etching process to pattern the hardmask layer and form a first portion of a patterned hardmask. As described more fully below, the first portion of the patterned hardmask will be utilized as both an etch mask during the etching process used to form the fins of the FinFETs and a regrowth mask during regrowth of the gate layer.

Concurrently with the formation of the first portion of the patterned hardmask in the device region 220, a second portion of the patterned hardmask is formed from the hardmask layer in the alignment mark region 230. As discussed in relation to FIG. 1, only a portion of the alignment mark mask areas typically used during semiconductor processing is illustrated for purposes of clarity. As described more fully below, the second portion of the patterned hardmask will be utilized as both an etch mask during the etching process used to form trenches in the alignment mark region and a regrowth mask during regrowth of the regrown fiducials. As illustrated in FIG. 2A, different patterns are formed in each of the device region 220 and the alignment mark region 230 as appropriate to the formation of fins for FinFETs and regrown fiducials for optical alignment processes.

FIG. 2B is a partial cross-sectional view of formation of patterned trenches according to an embodiment of the present invention. As illustrated in FIG. 2B, using the patterned hardmask, a set of fin trenches 224 are formed in the device region 220 and a set of alignment mark trenches 236 are formed in the alignment mark region 230. In one embodiment, the trenches each may have a depth of 0.8 μm. In order to provide a uniform depth for the trenches, good controllability of the etch process is utilized. In some embodiments, an etch process may include chlorine-based chemistry using reactive ion etching (RIE) to form the trenches, and a cleaning process may be carried out using a tetramethylammonium hydroxide (TMAH) solution after etching the semiconductor substrate. The trenches include sidewalls that are substantially perpendicular to the main surface of the semiconductor substrate. In some embodiments, the trench sidewalls in the device region are substantially parallel to the GaN m-plane. Because of the differing periodicity associated with the patterned hardmask in the device region and the alignment mark region, the dimensions of the trenches in the device region and the alignment mark region are different as appropriate to the FinFET structure and the regrown fiducial dimensions. As discussed above, although only three trenches in the device region and two sets of two alignment mark mask areas and three trenches are illustrated in FIG. 2B, it will be appreciated that this particular design is merely exemplary and other designs with different numbers of trenches and alignment mark mask areas are included within the scope of the present invention.

Figure 2C:
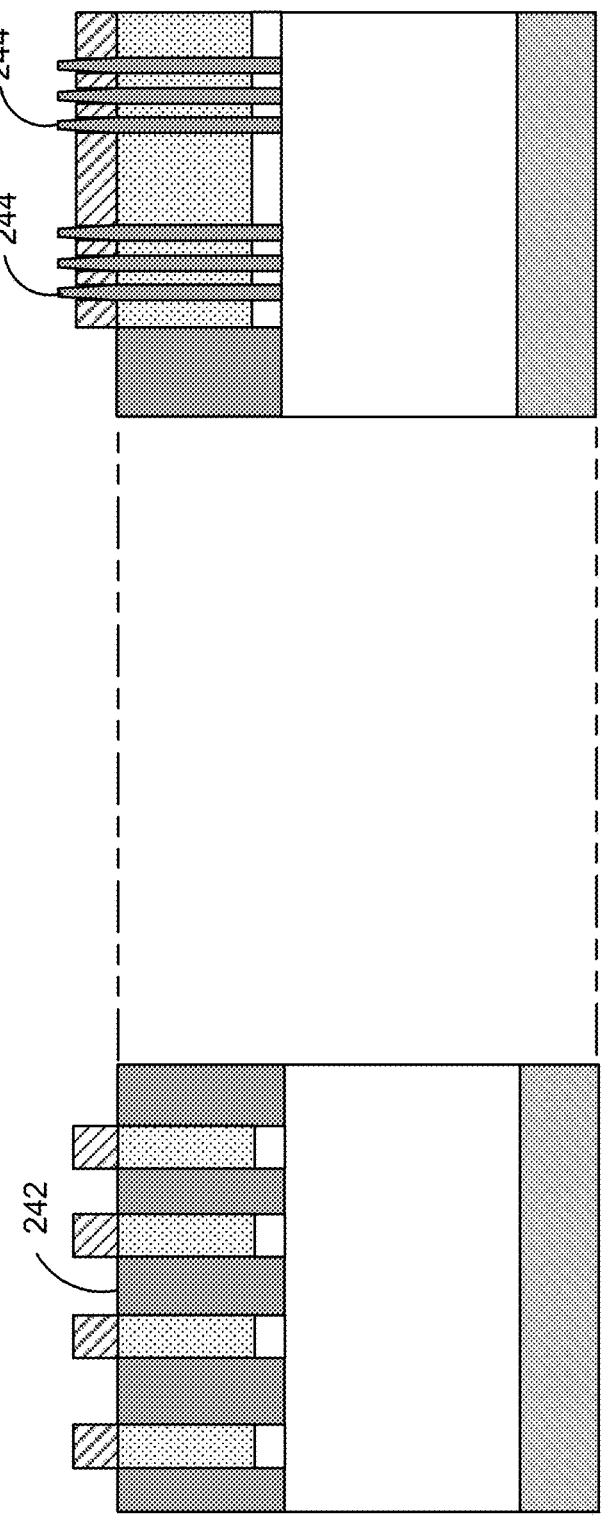
FIG. 2C is a partial cross-sectional view of regrowth in the device region and the alignment mark region according to an embodiment of the present invention.

FIG. 2C is a partial cross-sectional view of regrowth in the device region and the alignment mark region according to an embodiment of the present invention. As illustrated in FIG. 2C, a semiconductor material is epitaxially regrown in the trenches until the semiconductor material is substantially coplanar with the base of the hardmask in the device region. In one embodiment, the regrowth process may be a p-GaN regrowth by metalorganic chemical vapor deposition (MOCVD) that allows good in-plane control of thickness, strain, and bandgap energy. Accordingly, in a FinFET implementation, regrown gates are formed as regrown material 242.

At the same time, the semiconductor material is also epitaxially regrown in the alignment mark region to form a set of regrown fiducials 244 extending over an upper surface of the hardmask to a predetermined height. Although the regrown fiducials 244 illustrated in FIG. 2C extend above the upper surface of the patterned hardmask, this is not required and, in other embodiments, the regrown fiducials are characterized by a height between the upper surface of the channel layer and the upper surface of the patterned hardmask. One of ordinary skill in the art would recognize many variations, modifications, and alternatives.

The inventors have determined that by controlling the dimensions of the second portion of the patterned hardmask in the alignment mark region, it is possible to regrow fiducials that are tolerant to regrowth variation, resulting in controllable and repeatable regrowth of the regrowth fiducials in the trenches in the alignment mark region.

According to some embodiments, the epitaxial regrowth of the semiconductor layer in the alignment mark trenches has a portion protruding over the upper surface of the hardmask while the regrowth of the semiconductor layer in the openings in the device region has an upper surface disposed below the upper surface of the hardmask. The inventors have determined that, in some designs, because the width of the alignment mark openings is smaller than the width of the openings in the device region, the MOCVD growth rate in the alignment mark openings is higher than the MOCVD growth rate in the openings in the device region as a result of growth rate enhancement. It should be noted that the growth of the semiconductor layer in the alignment mark openings can be self-limiting when the protruding portion over the hardmask is characterized by a triangular shape. In one embodiment, the plane of the sidewall of the alignment mark opening is substantially parallel to the GaN m-plane, and the protruding portion over the hardmask has a height that is equal to about the square root of 3 divided by 2 times the alignment mark opening width $W_{tr}((\sqrt{3}/2) \times W_{tr})$. In one embodiment, a smooth surface of the regrowth facets can be obtained at a growth temperature in a range between 800° C. and 1150° C. and under a pressure of about 100 to 600 mbar with $H_2$ carrier gas. In one embodiment, the growth temperature is in a range between 850° C. and 1100° C., preferably between 900° C. and 1050° C., and more preferably between about 930° C. and 970° C., e.g., 950° C. in an embodiment. Thus, embodiments of the present invention utilize masks with two-dimensional shapes to grow three-dimensional alignment marks. The growth surfaces of the three-dimensional alignment marks (i.e., the regrowth facets are bounded by crystallographic planes that produce alignment marks that can be referred to as multi-directional (e.g., six directional)). As an example, the growth surfaces can be aligned parallel to the m-planes of the substrate, i.e., the <1000>, <0010> and <0100> axes. Additional description related to regrowth of semiconductor material and regrown fiducials is provided in commonly assigned U.S. Patent Application Publication No. 2021/0020580, published on Jan. 21, 2021, the disclosure of which is hereby incorporated by reference in its entirety for all purposes.

Figures 2D, 3A:
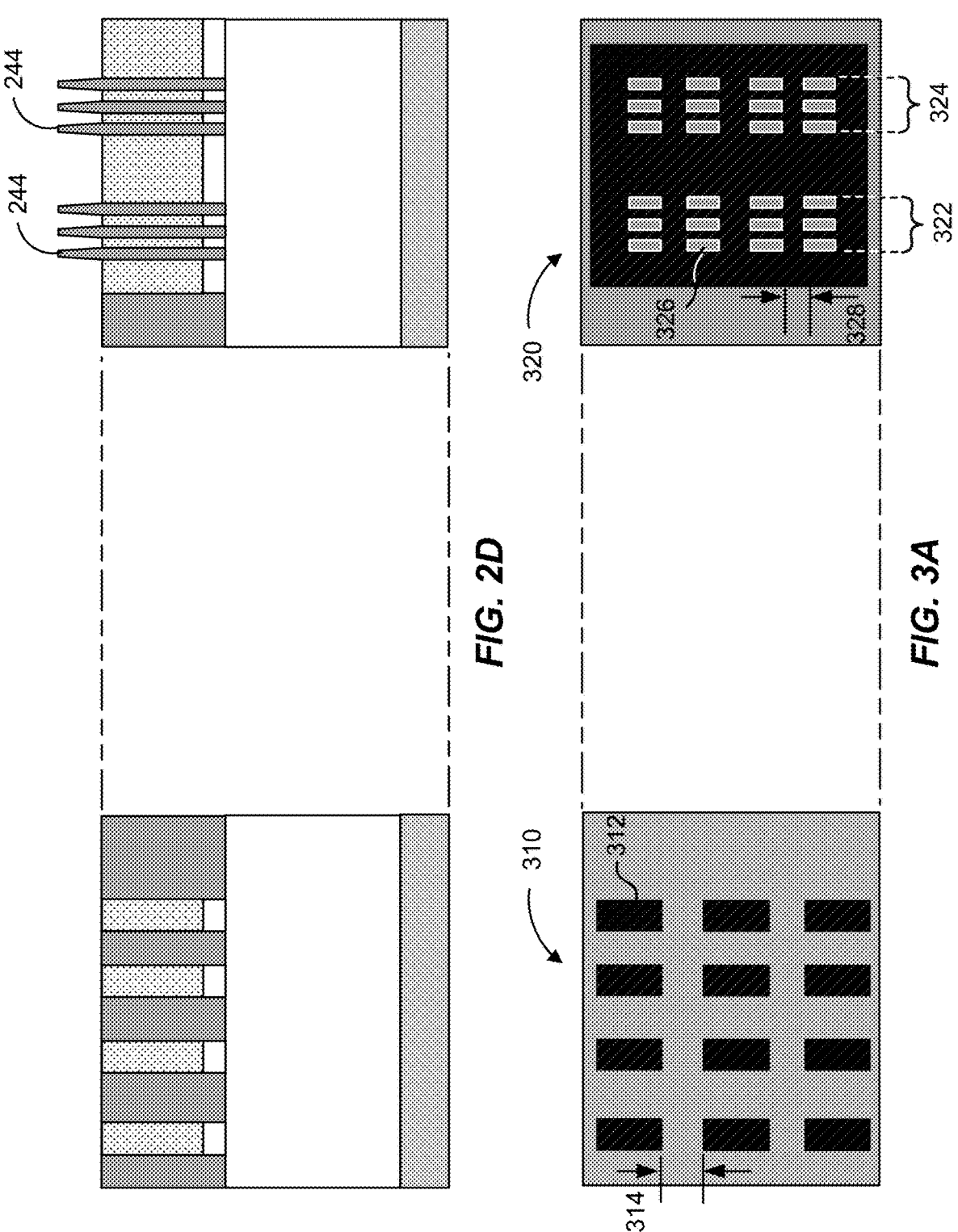
FIG. 2D is a partial cross-sectional view of the device region and the alignment mark region after hardmask removal according to an embodiment of the present invention.
FIG. 3A is a plan view of fin mask areas in the device region and the alignment mark mask areas in the alignment mark region according to an embodiment of the present invention.

FIG. 2D is a partial cross-sectional view of the device region and the alignment mark region after hardmask removal according to an embodiment of the present invention. As illustrated in FIG. 2D, the trenches have been filled in the device region and regrown fiducials extending above the upper surface of the second semiconductor layer have been formed in the alignment mark region. In some embodiments, instead of a blanket removal of the hardmask, a selective removal process may be performed such that the hardmask is not removed in the alignment mark region, resulting in a structure in the hardmask region similar to that shown in FIG. 2C. One of ordinary skill in the art would recognize many variations, modifications, and alternatives.

Although the process illustrated in FIGS. 2A-2D is related to vertical regrowth in the context of JFETs, this particular device structure is not required and other embodiments are applicable to the regrowth of lateral transistors. Moreover, as an alternative embodiment related to regrown JFETs, some embodiments utilize p-GaN for the fins of the FinFET and n-GaN for the regrown gate instead of the illustrated device that utilizes n-GaN for the fins of the FinFET and p-GaN for the regrown gate. One of ordinary skill in the art would recognize many variations, modifications, and alternatives.

FIG. 3A is a plan view of the fin mask areas in the device region and the alignment mark mask areas in the alignment mark region according to an embodiment of the present invention. In the device region 310, four sets of fin mask areas, each including three fin mask areas 312 having a width and a length, with a gap 314 disposed between fin mask areas along the length direction, are illustrated. Of course, these numbers for the sets and the fin mask areas are merely exemplary. In the alignment mark region 320, two sets of mask openings in which regrown fiducials are formed, i.e., first set of mask openings 322 and second set of mask openings 324, are illustrated, resulting in each set of regrown fiducials including regrown fiducials 326 disposed in a 3×4 array. Of course, these numbers for the sets and the regrown fiducials are merely exemplary.

In FIG. 3A, the patterned hardmask in the hardmask area is illustrated as a solid hardmask area with each set of 12 hardmask openings being used to form 12 regrown fiducials 326 disposed in the illustrated 3×4 array geometry. In this particular embodiment, each column of regrown fiducials includes regrown fiducials 326 with a gap 328 disposed between regrown fiducials along the length direction.

Figure 3B:
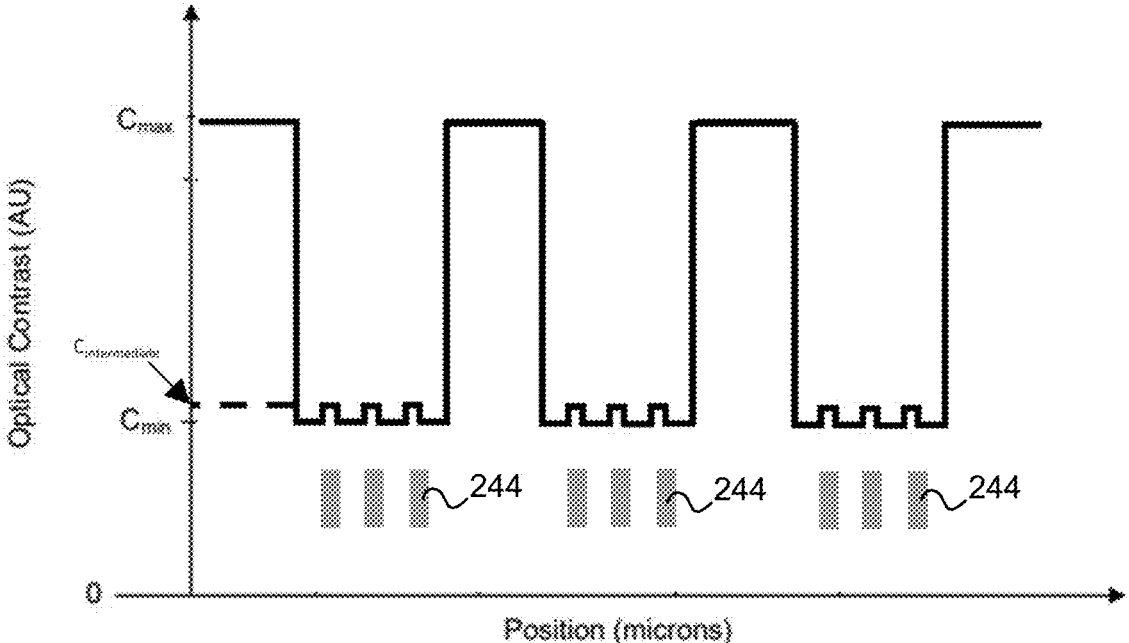
FIG. 3B is a simplified plot illustrating optical contrast as a function of position for the set of regrown fiducials illustrated in FIG. 2D.

FIG. 3B is a simplified plot illustrating optical contrast as a function of position for the set of regrown fiducials illustrated in FIG. 2D. The relative position of the regrown fiducials 244 is illustrated with respect to the position of the peaks in the optical contrast. In some embodiments, the resolution of the camera used during imaging of the regrown fiducials is characterized by a lower resolution than the size of the regrown fiducials, for example, the dimensions of the regrown fiducials and/or spacing between adjacent regrown fiducials in the width direction or the length direction. In these embodiments, the contrast measured by the camera used to image the regrown fiducials is similar to that shown in FIG. 3B, with a contrast that does not reach level $C_{min}$ inside the set of regrown fiducials, but only between sets of regrown fiducials. As a result, the contrast measured inside the set of regrown fiducials ranges between $C_{intermediate}$ and $C_{max}$, thereby providing a more uniform contrast associated with the set of regrown fiducials and a high contrast between the set of regrown fiducials and the region between the sets of regrown fiducials, which may be associated with the hardmask or may be associated with the second semiconductor layer. Accordingly, establishing the position of the alignment marks is performed more accurately using embodiments of the present invention than available using conventional techniques.

FIG. 4 is a simplified flowchart illustrating a method of forming regrown fiducials (i.e., regrown fiducials making up alignment marks) during the formation of integrated circuits on semiconductor wafers according to an embodiment of the present invention. The method 400 includes providing a III-V compound substrate having a device region and an alignment mark region (410). The III-V compound substrate is characterized by a processing surface. The III-V compound substrate can include a GaN substrate and a plurality of epitaxial III-V layers. The III-V compound substrate can include an n-GaN epitaxial layer and the semiconductor layer can include a p-GaN epitaxial layer.

The method also includes forming a hardmask layer having a first set of openings on the device region exposing a first surface portion of the processing surface of the III-V compound substrate and a second set of openings on the alignment mark region exposing a second surface portion of the processing surface of the III-V compound substrate (412). In one embodiment, a hardmask layer includes silicon nitride and may be formed on the substrate by a PECVD or a LPCVD process. The hardmask layer is then patterned by lithography that includes forming a patterned photoresist on the hardmask layer and then etching the hardmask layer to form a patterned hardmask layer. In one embodiment, the patterned hardmask layer has a first set of openings in the device region exposing a first surface portion of the substrate and a second set of openings in the alignment mark region exposing a second surface portion of the substrate, as shown in FIG. 2A. The first set of openings can include an array of elongated openings arranged in parallel to each other and configured to form a plurality of semiconductor fins. The elongated openings can each have a width in a range between about 0.2 μm and about 0.3 μm, and a length in a range between about 100 μm and about 1000 μm, and a pitch between two adjacent elongated openings can be in a range between about 1.9 μm and about 10 μm.

The method further includes etching the first surface portion and the second surface portion of the III-V compound substrate using the hardmask layer as a mask to form a plurality of trenches (414) and epitaxially regrowing a semiconductor layer in the trenches to form the regrown fiducials extending to a predetermined height over the processing surface of the III-V compound substrate in the alignment mark region (416). In one embodiment, the growth of the regrown fiducials may be self-limited and the regrown fiducials may have a shape of an isosceles triangle or a trapezoid with a base that is substantially flush with the substrate. For example, the regrown fiducials can have a height that is equal to $H=(\sqrt{3}/2)*W_{tr}$, where $W_{tr}$ is a width of a trench opening defined by the patterned hardmask layer. The trenches can each have a depth of about 0.8 μm and the trenches in the device region can each have a width of about 1.8 μm. A width of the hardmask layer between two adjacent openings can be in the range of fractions of a micron to several microns as discussed above. In some embodiments, the trenches in the alignment mark region can each have a pitch in the range of fractions of a micron to several microns as discussed above. In these embodiments, the width of the hardmask layer between two adjacent openings can be in the range of fractions of a micron to several microns. Epitaxially regrowing the semiconductor layer can be a self-limiting process in the alignment mark region.

Concurrently with the epitaxial regrowth of the regrown fiducials, the semiconductor layer can also epitaxially regrow semiconductor material in the device region, thereby forming, for example, the gates of the FinFETs. In some embodiments, the hardmask is removed after the epitaxial regrowth process.

In some embodiments, the trenches in the device region are characterized by a first pitch and the trenches in the alignment mark region are characterized by a second pitch less than the first pitch. A set of regrown fiducials in the alignment mark region can form an alignment mark as discussed below in relation to FIG. 5. The regrown fiducials are elongated in some implementations and the length of the regrown fiducials, which is greater than the width of the regrown fiducials, can be parallel to an m-plane of the III-V compound substrate.

It should be appreciated that the specific steps illustrated in FIG. 4 provide a particular method of forming regrown fiducials during the formation of integrated circuits on semiconductor wafers according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
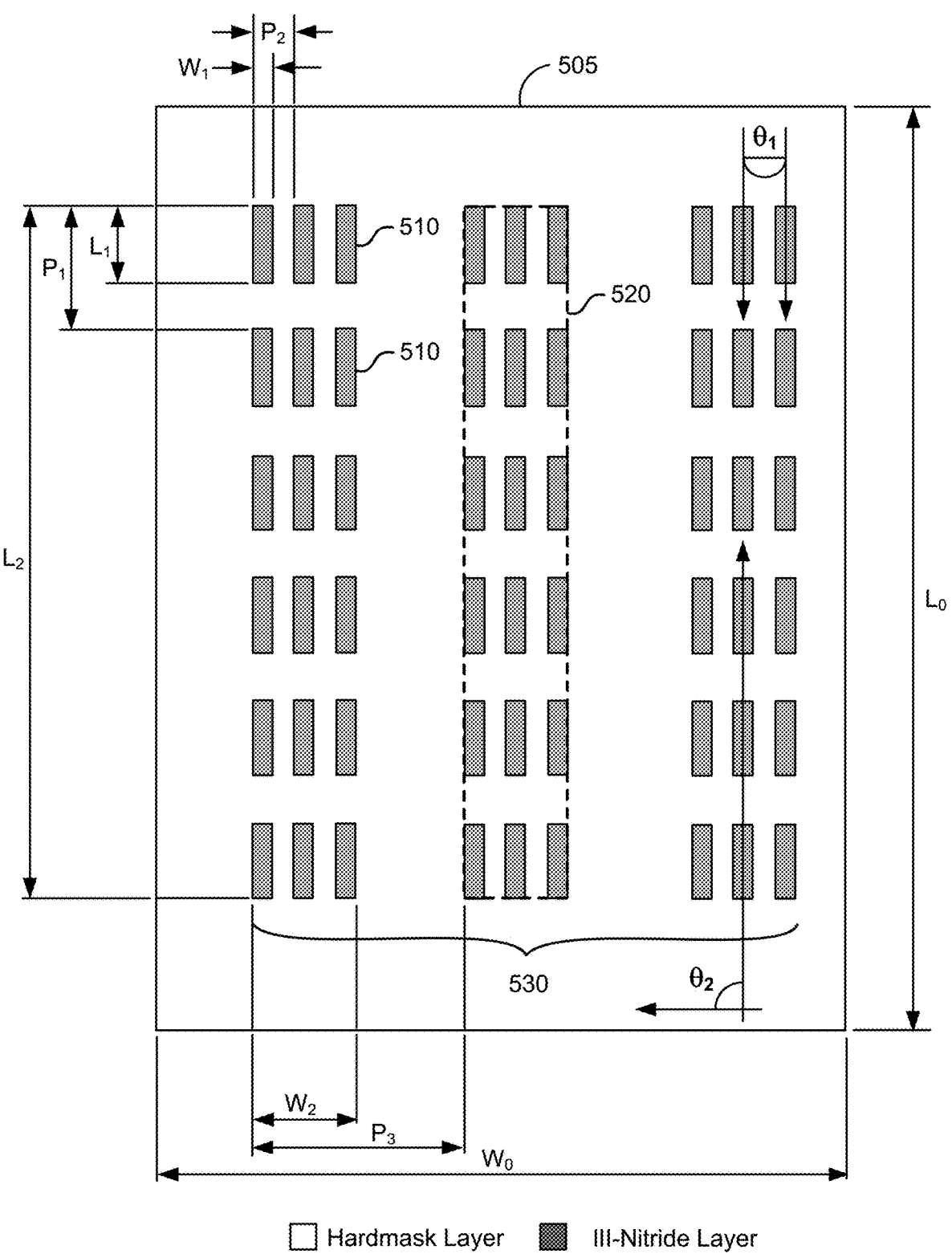
FIG. 5 is a plan view of regrown fiducials in the alignment mark region according to an embodiment of the present invention.

FIG. 5 is a plan view of regrown fiducials in the alignment mark region according to an embodiment of the present invention. In FIG. 5, regrown fiducials 510 are illustrated along with hardmask area 505. Each of the regrown fiducials 510 is characterized by length $L_1$ and a width $W_1$. In this example, each set of regrown fiducials includes six rows and three columns of regrown fiducials. Each set of regrown fiducials, which can be referred to as an alignment mark 520, is characterized by a length $L_2$ and a width $W_2$. Of course, this number of rows and columns of regrown fiducials in each alignment mark and the number of alignment marks, three in this example, are merely exemplary. Each regrown fiducial is separated from the regrown fiducials in the set by pitch $P_1$ in the length direction and pitch $P_2$ in the width direction. Accordingly, $P_1$ can be referred to as a longitudinal pitch since it is measured along the length of the regrown fiducials whereas $P_2$ can be referred to as a lateral pitch since it is measured along the width of the regrown fiducials. As stated above, each set of regrown fiducials makes up an alignment mark 520 and, in this example, three alignment marks make up an alignment mark pattern 530. Each alignment mark is separated from the other alignment marks by pitch $P_3$ in the width direction. Thus, each alignment mark pattern will include a plurality of periodically arranged alignment marks, which can be regularly spaced in an arrayed manner to form the alignment mark pattern. The alignment marks can be linear, rectangular, circular, squares, combinations thereof, or the like.

The hardmask area has a width $W_0$ and a length $L_0$. Within each set of regrown fiducials, the regrown fiducials can be oriented at any angle $0°\leq\theta_1\leq180°$ with respect to each other. Additionally, each set of regrown fiducials can be oriented at any angle $0°\leq\theta_2\leq90°$ with respect to the hardmask area.

As discussed in relation to FIG. 3B, when the resolution of the camera used during imaging of the regrown fiducials is characterized by a lower resolution than the size of the regrown fiducials, for example, the spacing between adjacent regrown fiducials in the width direction or the length direction, the image formed by the camera for the pattern illustrated in FIG. 5 will be of three vertical lines, each corresponding to a single alignment mark 520, separated by pitch $P_3$. For example, the width $W_1$ can range from about 0.1 µm to 1.0 µm, for example, 0.1 µm, 0.2 µm, 0.3 µm, 0.4 µm, 0.5 µm, 0.6 µm, 0.7 µm, 0.8 µm, 0.9 µm, 1.0 µm, or greater than 1.0 µm. The pitch $P_2$ in the width direction can range from about 0.2 µm to 4.0 µm, resulting in the gap between regrown fiducials in the width direction (i.e., $P_2-W_1$) being in the range of 0.1 µm to 3.9 µm, for example, 0.2 µm, 0.3 µm, 0.4 µm, 0.5 µm, 0.6 µm, 0.7 µm, 0.8 µm, 0.9 µm, 1.0 µm, 1.5 µm, 2.0, µm, 2.5 µm, 3.0 µm, 3.5 µm, or greater than 3.5 µm. The width $W_1$ can be half of the pitch $P_2$, resulting in the regrown fiducials and the gap between regrown fiducials being equal, or the pitch $P_2$ can be less than the width $W_1$ or greater than twice the width $W_1$, resulting in different array configurations for the regrown fiducials, depending on the particular application.

The dimensions of the alignment marks 520, $W_2$ and $L_2$ can also vary as appropriate to the particular application. The width $W_2$ can range from sub-micron to tens of microns, for example, less than 1 µm, 1.5 µm, 2 µm, 2.5 µm, 3 µm, 3.5 µm, 4 µm, 4.5 µm, 5 µm, 6 µm, 7 µm, 8 µm, 9 µm, 10 µm, or greater than 10 µm. The pitch $P_3$ at which the alignment marks 520 are arrayed can be in the range of one to tens of microns, for example, 1 µm, 1.5 µm, 2 µm, 2.5 µm, 3 µm, 3.5 µm, 4 µm, 4.5 µm, 5 µm, 6 µm, 7 µm, 8 µm, 9 µm, 10 µm, 11 µm, 12 µm, 13 µm, 14 µm, 15 µm, 20 µm, 25 µm, 30 µm, or greater than 30 µm.

Accordingly, referring to FIG. 5, a photolithography tool manufacturer may specify or recommend the dimensions associated with alignment marks in a set of alignment marks. As an example, a photolithography tool manufacturer could specify that a set of alignment marks consist of a plurality of alignment marks, for example, a set of two to 15 alignment marks, each having dimensions of $L_2 \times W_2$ and a pitch of $P_3$. The set of alignment marks can be arrayed in the direction of their width, with the three alignment marks 520 having dimensions of $L_2 \times W_2$ illustrated in FIG. 5 making up an alignment mark pattern 530 including the set of three alignment marks. Within each alignment mark 520, a plurality of regrown fiducials 510 are arrayed, in either the width direction, the length direction, or both, thereby subdividing each alignment mark into smaller units corresponding to the regrown fiducials. For example, the pitch of the regrown fiducials in the width direction can be less than the pitch of the alignment marks in the width direction, illustrated in FIG. 5 by pitch $P_2$ being less than pitch $P_3$. Additionally, in the embodiment illustrated in FIG. 5, the length of each alignment mark can be subdivided into a set of regrown fiducials with pitch $P_1$ being less than $L_2$.

In addition to the pitch of the regrown fiducials being less than the pitch of the alignment mark, resulting in the alignment mark being subdivided into smaller units, the dimensions and pitch of the regrown fiducials can be compared to the dimensions and/or pitch of the electronic devices fabricated on the substrate on which the alignment marks are formed. As an example, the pitch of the regrown fiducials in the width direction can be less than the pitch of the FinFETs fabricated in the device region. Thus, in addition to use of the alignment marks as a reference, the electronic devices, including FinFETs, can be utilized as the reference to which the dimensions and/or pitch of the regrown fiducials are compared. Using regrown fiducials with dimensions smaller than the alignment marks, the contrast associated with each alignment mark can be increased in comparison to designs in which the alignment mark is formed as a single structure.

It should be noted that there are multiple variations corresponding to the layout of the regrown fiducials and the alignment marks. A number of these variations are discussed in the following figures. For example, $L_0$, $W_0$, $L_1$, $W_1$, $P_1$, $P_2$, $L_2$, $W_2$, and/or $P_3$ can have values of zero or any positive real number value. Additionally, $\theta_1$, $\theta_2$ can have any positive real number value such that $0°\leq\theta_1\leq180°$ and $0°\leq\theta_2\leq90°$ respectively.

Figure 6:
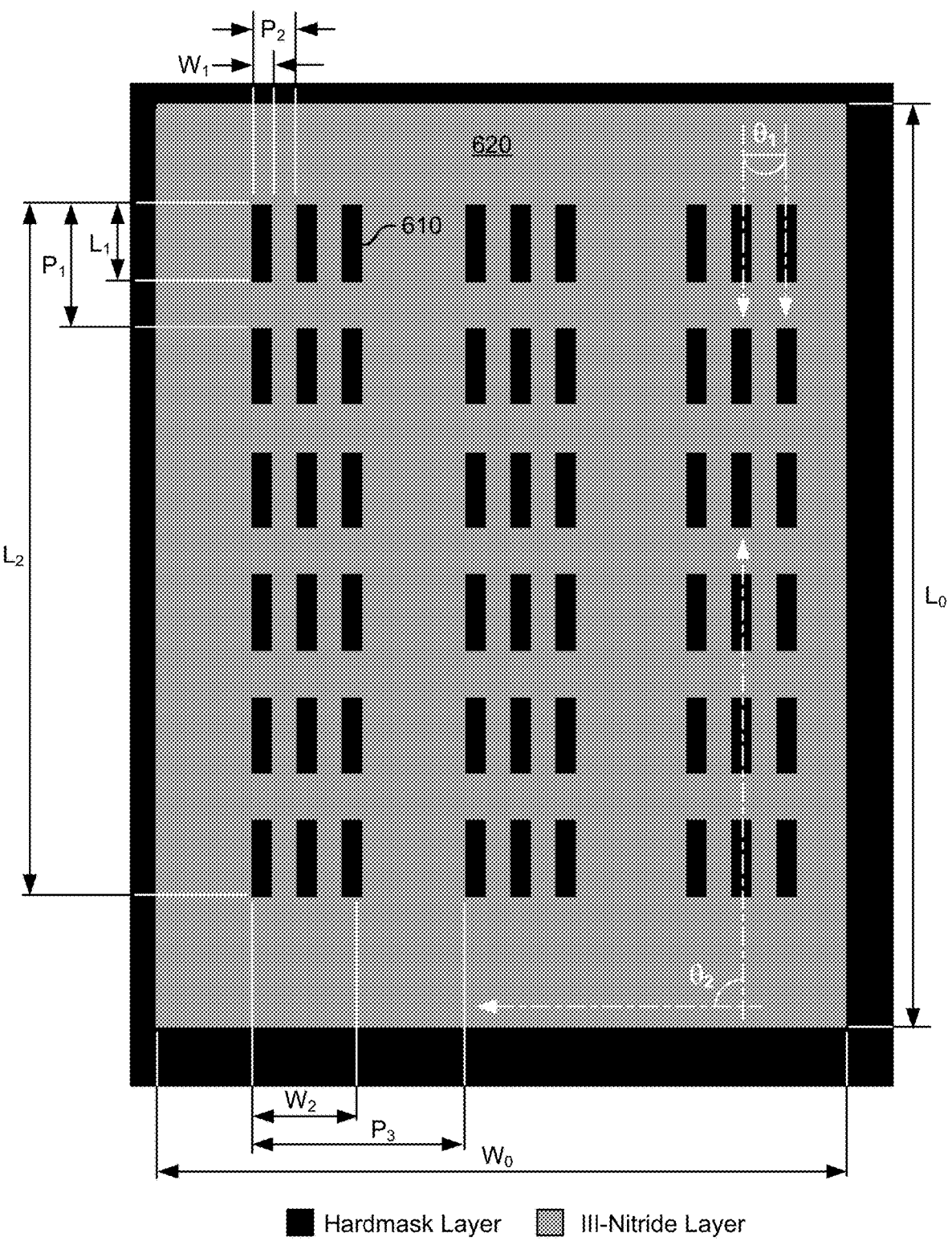
FIG. 6 is a plan view of a regrown alignment mark structure according to an alternative embodiment of the present invention.

FIG. 6 is a plan view of a regrown alignment mark structure according to an alternative embodiment of the present invention. In this alternative embodiment, which in imaging terms is the negative of the embodiment illustrated in FIG. 5, regrowth occurs in regrowth area 610 and hardmask areas 620 serve as a regrowth mask to prevent regrowth. Thus, a regrown alignment mark structure with gaps corresponding to the hardmask areas 620 is produced. In this embodiment, the contrast will be opposite to that associated with the regrown fiducials in the alignment mark region since, rather than having regrown fiducials with regrowth prevented in other portions of the alignment mark region, this embodiment utilizes a regrown alignment mark structure with no regrowth in areas masked by hardmask areas 620.

FIGS. 7A and 7B are plan views of regrown fiducials for a set of X alignment marks and a set of Y alignment marks, respectively, according to a first embodiment of the present invention. In FIGS. 7A and 7B, the same planes for regrowth are exposed for both x-direction alignment marks and y-direction alignment marks. Thus, in this embodiment, three x-direction alignment marks are each formed by a set of three regrown fiducials 710, with the length of the regrown fiducials being orthogonal to the x-direction. For the three y-direction alignment marks, the length of the regrown fiducials in each alignment mark is parallel to the x-direction.

In FIG. 7A, an alignment mark pattern including three alignment marks is illustrated, with each alignment mark 705 including three regrown fiducials 710, although this number of alignment marks and this number of regrown fiducials are merely exemplary. As described herein, embodiments of the present invention utilize alignment marks that are made up of a plurality of smaller regrown fiducials. The smaller regrown fiducials will have at least one dimension (e.g., width or length) that is smaller than the corresponding dimension of the alignment mark. In FIG. 7A, the width of the regrown fiducials is less than the width of the alignment mark while the length of the regrown fiducials and the length of the alignment mark are equal. In other embodiments, both dimensions of the regrown fiducials are smaller than the corresponding dimensions of the alignment mark. In FIG. 7B, each alignment mark 715 includes three regrown fiducials 720, although this number of regrown fiducials is merely exemplary. In FIG. 7B, the width of the regrown fiducials is less than the width of the alignment mark while the length of the regrown fiducials and the length of the alignment mark are equal.

FIGS. 7C and 7D are plan views of regrown fiducials for a set of X alignment marks and a set of Y alignment marks, respectively, according to a second embodiment of the present invention. In FIGS. 7C and 7D, the regrown fiducials in the x-direction alignment marks have their lengths aligned with the y-direction and the regrown fiducials in the y-direction alignment marks also have their lengths aligned with the y-direction, resulting in better regrowth uniformity for both the X alignment marks and the Y alignment marks. Additional description related to methods and systems for achieving regrowth uniformity is provided in commonly assigned U.S. Patent Application Publication No. 2021/0210624, published on Jul. 8, 2021, the disclosure of which is hereby incorporated by reference in its entirety for all purposes.

FIGS. 7E and 7F are plan views of regrown fiducials for a set of X alignment marks and a set of Y alignment marks, respectively, according to a third embodiment of the present invention. For the x-direction alignment marks illustrated in FIG. 7E, each of the regrown fiducials in each of the three alignment marks has an equal area. The area of each of the regrown fiducials can be equal to the area of each of the regrown fiducials in each of the three y-direction alignment marks shown in FIG. 7F. In a manner similar to the regrown fiducials illustrated in FIGS. 7D, the lengths of the regrown fiducials illustrated in both FIGS. 7E and 7F are reduced in comparison to the regrown fiducials illustrated in FIG. 7C, resulting in improved regrowth uniformity. In FIG. 7E, the length of the regrown fiducials making up each alignment mark is parallel to the length of the alignment mark, whereas in FIG. 7F, the length of the regrown fiducials making up each alignment mark is orthogonal to the length of the alignment mark. In order to achieve self-limiting growth, some embodiments align the length of the regrown fiducials with the m-plane of a GaN substrate. Thus, in both FIGS. 7E and 7F, although the lengths of the x-direction alignment marks and the y-direction alignment marks are orthogonal to each other, the length of the regrown fiducials are parallel for both the x-direction alignment marks and the y-direction alignment marks and the length of the regrown fiducials can be aligned to the m-plane of the GaN substrate.

FIGS. 8A and 8B are plan views of regrown fiducials for a set of X alignment marks and a set of Y alignment marks, respectively, according to a fourth embodiment of the present invention. In this embodiment, the x-direction alignment marks are similar to those illustrated in FIG. 7E, but with each column of fiducials within the alignment marks offset along the length of the alignment marks, resulting in improved regrowth uniformity. The regrown fiducials illustrated in FIG. 8B are similar to those illustrated in FIG. 7D.

FIGS. 8C and 8D are plan views of regrown fiducials for a set of X alignment marks and a set of Y alignment marks, respectively, according to a fifth embodiment of the present invention. In this embodiment, a combination of the regrown fiducials illustrated in FIGS. 7A and 7E are utilized for the x-direction alignment marks and the regrown fiducials illustrated in FIG. 8D are similar to those illustrated in FIG. 7D. For the x-direction alignment marks, a set of regrown fiducials with a length $L_2$ are utilized for forming each of the outer portions of the alignment marks. Between the two alignment marks with length $L_2$, two regrown fiducials of length $L_1$ are formed. The use of six regrown fiducials to form each alignment mark is merely exemplary and other numbers of regrown fiducials can be utilized.

FIGS. 8E and 8F are plan views of regrown fiducials for a set of X alignment marks and a set of Y alignment marks, respectively, according to a sixth embodiment of the present invention. In this embodiment, the x-direction alignment marks are based on the x-direction alignment marks illustrated in FIG. 8C, but with different length regrown fiducials and the regrown fiducials illustrated in FIG. 8F are similar to those illustrated in FIG. 7D. For the x-direction alignment marks, a set of regrown fiducials with a length between $L_2$ and $L_1$ are utilized for forming each of the outer portion of the alignment marks. In the embodiment illustrated in FIG. 8E, the regrown fiducials of length $L_2$ illustrated in FIG. 8C are divided into three regrown fiducials of length approximately $L_2/3$, but this is merely exemplary. Between the two alignment marks with length $\sim L_2/3$, two regrown fiducials of length $L_1$ are formed. The use of two regrown fiducials is merely exemplary and other numbers of regrown fiducials can be utilized.

Figure 9A:
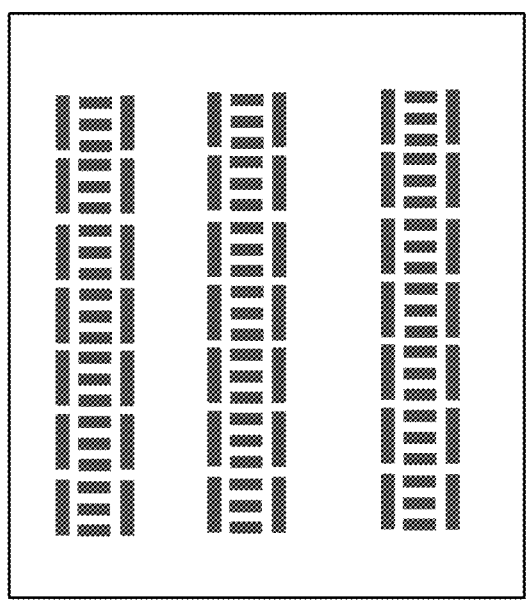
FIGS. 9A and 9B are plan views of regrown fiducials for a set of X alignment marks and a set of Y alignment marks, respectively, according to a seventh embodiment of the present invention.
Figure 9B:

FIGS. 9A and 9B are plan views of regrown fiducials for a set of X alignment marks and a set of Y alignment marks, respectively, according to a seventh embodiment of the present invention. In this embodiment, for the x-direction alignment marks, the orientation of a first set of the regrown fiducials in an alignment mark is orthogonal to the orientation of a second set of the regrown fiducials in the alignment mark in order to provide different regrowth planes within an alignment mark. In FIG. 9A, two alignment marks similar to those illustrated in FIG. 7E are utilized for the outer sets of fiducials, with each of the regrown fiducials in the outer sets of fiducials having an equal area, which is also equal to each of the regrown fiducials in each of the three y-direction alignment marks shown in FIG. 7F. In FIG. 9A, the regrown fiducials in the outer sets of fiducials have a length of approximately $L_1$. In between the two outer sets of fiducials, a set of three regrown fiducials with an orientation orthogonal to the orientation of the regrown fiducials in the outer sets of fiducials is formed between each of the regrown fiducials in the outer sets of fiducials. Referring to FIG. 5, the angle $\theta_1$, representing the angle between regrown fiducials in an alignment mark, is 90°, resulting in different planes being exposed for regrowth for the regrown fiducials in the outer sets of fiducials and the regrown fiducials in the set of three regrown fiducials between the regrown fiducials of the outer sets of fiducials. The regrown fiducials in the set of three regrown fiducials can have a length of approximately $L_1$, although this is not required by the present invention. The regrown fiducials illustrated in FIG. 9B are similar to those illustrated in FIG. 7B.

The above-described embodiments have a vertical regrown semiconductor layer both in the alignment mark region and in the device (active) region. The alignment mark region includes an array of alignment marks that may include a variety of patterns. The device or active region may include a plurality of semiconductor fins arranged in parallel to each other. The alignment marks and the semiconductor fins can be arranged in the same direction or in different directions. In some embodiments, the alignment marks can be placed in a periphery of a wafer (substrate), in a periphery of device boundaries, or in a scribe line of a wafer (substrate). The regrown portion of the semiconductor layer in the alignment mark region protrudes over the upper surface of the hardmask layer. In one embodiment, the regrown portion of the semiconductor layer in the device region has an upper surface that is substantially flush with a bottom surface of the hardmask layer, i.e., substantially flush with an upper surface of the substrate when the hardmask layer is removed. In one embodiment, the surface of the substrate is in the c-plane, and the regrowth portion of the semiconductor layer is oriented along the m-plane directions (i.e., the edge of the regrowth where it intersects the c-plane is in one of the [1000], [0100], or [0010] directions).

In one embodiment, the protruding portion of the semiconductor layer in the alignment region is self-limiting and has a thickness of height $H=(\sqrt{3}/2)*W$, where W is a width of a trench opening defined by the hardmask layer.

In one embodiment, the alignment mark region has a plurality of trenches, each having a depth of about 0.8 μm, a width of about 0.7 μm, and a width of the hardmask layer between two adjacent openings of about 3 μm.

In one embodiment, the hardmask layer in the device or active region includes an array of elongated openings arranged in parallel to each other configured to form a plurality of semiconductor fins. In one embodiment, the elongated openings each have a width in a range between about 0.2 μm and about 0.3 μm, a length in a range between about 25 μm and about 1000 μm, and a pitch between two adjacent elongated openings is in a range between about 1.9 μm and about 10 μm. The scope of the present disclosure is not limited to the arrangement of the fins in the drawings in relation to the alignment marks.

In one embodiment, the substrate is a III-V compound substrate including an n-GaN epitaxial layer, and the semiconductor layer includes a p-GaN regrown epitaxial layer.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A method of forming regrown fiducials, the method comprising:
   providing a III-V compound substrate having a device region and an alignment mark region, wherein the III-V compound substrate is characterized by a processing surface;
   forming a hardmask layer having a first set of openings in the device region exposing a first surface portion of the processing surface of the III-V compound substrate and a second set of openings in the alignment mark region exposing a second surface portion of the processing surface of the III-V compound substrate;
   etching the first surface portion and the second surface portion of the III-V compound substrate using the hardmask layer as a mask to form a plurality of trenches; and
   epitaxially regrowing a semiconductor layer in the plurality of trenches to form the regrown fiducials extending to a predetermined height over the processing surface of the III-V compound substrate in the alignment mark region.

2. The method of claim 1 wherein the III-V compound substrate comprises a GaN substrate and a plurality of epitaxial III-V layers.

3. The method of claim 1 wherein the each of the plurality of trenches comprise a depth of about 0.8 μm.

4. The method of claim 1 wherein the plurality of trenches in the device region each have a width of about 2 μm.

5. The method of claim 1 wherein a width of the regrown fiducials is between 0.1 μm and 1 μm and a pitch of the regrown fiducials is between 0.2 μm and 1.2 μm.

6. The method of claim 5 wherein the width is between 0.4 μm and 0.6 μm and the pitch is between 0.5 μm and 1.2 μm.

7. The method of claim 1 wherein the plurality of trenches in the device region are characterized by a first pitch and the regrown fiducials are characterized by a second pitch less than the first pitch.

8. The method of claim 1 wherein a set of regrown fiducials in the alignment mark region forms an alignment mark.

9. The method of claim 1 wherein the regrown fiducials are elongated and a length of the regrown fiducials is parallel to an m-plane of the III-V compound substrate.

10. The method of claim 1 wherein the first set of openings comprises an array of elongated openings arranged in parallel to each other configured to form a plurality of semiconductor fins.

11. The method of claim 10 wherein the elongated openings each have a width in a range between about 0.2 μm and about 0.3 μm, a length in a range between about 10 μm and about 1000 μm, and a pitch between two adjacent elongated openings is in a range between about 1.9 μm and about 10 μm.

12. The method of claim 1 wherein the III-V compound substrate comprises an n-GaN epitaxial layer and the semiconductor layer comprises a p-GaN epitaxial layer.

13. The method of claim 1 wherein epitaxially regrowing the semiconductor layer is self-limiting in the alignment mark region.

* * * * *